US009065216B2

(12) United States Patent
Chang et al.

(10) Patent No.: US 9,065,216 B2
(45) Date of Patent: Jun. 23, 2015

(54) ELECTRICAL CONNECTOR HAVING A PLURALITY OF ABSORBING MATERIAL BLOCKS

(71) Applicant: HON HAI PRECISION INDUSTRY CO., LTD., New Taipei (TW)

(72) Inventors: Yen-Chih Chang, New Taipei (TW); Tzu-Yao Hwang, New Taipei (TW); Ke-Hao Chen, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/093,532

(22) Filed: Dec. 2, 2013

(65) Prior Publication Data

US 2014/0154918 A1    Jun. 5, 2014

(30) Foreign Application Priority Data

Nov. 30, 2012  (TW) .............................. 101144866 A

(51) Int. Cl.
*H01R 12/00* (2006.01)
*H01R 13/648* (2006.01)
*H01R 9/03* (2006.01)
*H01R 13/6598* (2011.01)
*H01R 13/6585* (2011.01)
*H05K 7/10* (2006.01)

(52) U.S. Cl.
CPC ............ *H01R 13/6598* (2013.01); *H01R 12/00* (2013.01); *H01R 13/648* (2013.01); *H01R 9/03* (2013.01); *H01R 13/6585* (2013.01); *H05K 7/1061* (2013.01)

(58) Field of Classification Search
CPC ....................................................... H01R 12/00
USPC .............. 439/66, 83, 607.01, 607.02, 607.03, 439/607.28, 626, 733.1, 607.55, 607.09, 439/607.12, 71, 591, 862, 65
See application file for complete search history.

(56) References Cited

U.S. PATENT DOCUMENTS

| 8,147,256 | B2 * | 4/2012 | Jin ................................. 439/83 |
| 8,323,038 | B2 * | 12/2012 | Jin ................................. 439/83 |
| 8,851,904 | B2 * | 10/2014 | Chang et al. .................... 439/71 |
| 2009/0111325 | A1 * | 4/2009 | Ju ............................. 439/607.55 |

FOREIGN PATENT DOCUMENTS

CN              202189914 U           4/2012

* cited by examiner

*Primary Examiner* — Abdullah Riyami
*Assistant Examiner* — Harshad Patel
(74) *Attorney, Agent, or Firm* — Wei Te Chung; Ming Chieh Chang

(57) ABSTRACT

An electrical connector electrically connecting a chip module to a printed circuit board includes an insulative housing including a number of receiving slots and a number of passageways spaced with the receiving slot and located beside the receiving slot and a number of terminals each received in the receiving slot of the insulative housing, the electrical connector further includes a number of absorbing material blocks received in the passageways, the passageway has an inner surface coated with an metal layer and the absorbing material block is located inside the metal layer.

20 Claims, 5 Drawing Sheets

ELECTRICAL CONNECTOR HAVING A PLURALITY OF ABSORBING MATERIAL BLOCKS

BACKGROUND OF THE INVENTION

1. Field of the Invention

The present invention relates to an electrical connector, and more particularly to an electrical connector has a plurality of absorbing material blocks made of absorbing material for improving the shielding effect.

2. Description of the Related Art

As the "Nonlinear Analysis Helps Design LGA Connectors" (Connector Specifier, February 2001) show, an electrical connector includes a base and a number of contacts assembled in the base. Each of the contacts defines an upper contacting point for contacting with a CPU and a lower contacting point for contacting with a printed circuit board, thus to establish an electrical connection between the CPU and the printed circuit board. With the development of the electronic technology, the size of the electrical connector becomes smaller and smaller, so the density of the pads of the CPU and the printed circuit board becomes larger and larger. So, the electromagnetic interference between the adjacent contacts becomes serious and it affects the quality of the signal transmission between the CPU and the printed circuit board A conventional electrical connector is described in Chinese Patent issued No. 202189914, issued to ZHU on Apr. 11, 2012. The electrical connector includes a pedestal having a plurality of accepting grooves Inner surfaces of at least some of the accepting grooves are coated with a coating object. The coating object includes at least absorbing material layer and metal layer set on the absorbing material layer. A plurality of conductive terminals are arranged in the accepting grooves, and each of the conductive terminals includes a contact part extending beyond one side of the pedestal, a main body part extending from the contact part and then extending into the accepting groove, and a connecting section extending beyond the accepting groove from the main body part. However, it is complicated to coat absorbing material layer on the inner surfaces and due to the limitation of the distance between the adjacent conductive terminals, the cost will increase while the thickness of the absorbing material layer being added. But if the thickness of the absorbing material layer is too thin, the absorbing effect is bad.

Therefore, it is needed to find a new electrical socket to overcome the problems mentioned above.

SUMMARY OF THE INVENTION

Accordingly, an object of the present invention is to provide a plurality of absorbing material blocks made of absorbing material for getting better shielding effect.

In order to achieve the object set forth, an electrical connector electrically connecting a chip module to a printed circuit board includes an insulative housing including a number of receiving slots and a number of passageways spaced with the receiving slot and located beside the receiving slot and a number of terminals each received in the receiving slot of the insulative housing, the electrical connector further includes a number of absorbing material blocks received in the passageways, the passageway has an inner surface coated with an metal layer and the absorbing material block is located inside the metal layer.

DESCRIPTION OF PREFERRED EMBODIMENT

Reference will now be made to the drawings to describe the present invention in detail.

Figure 1:
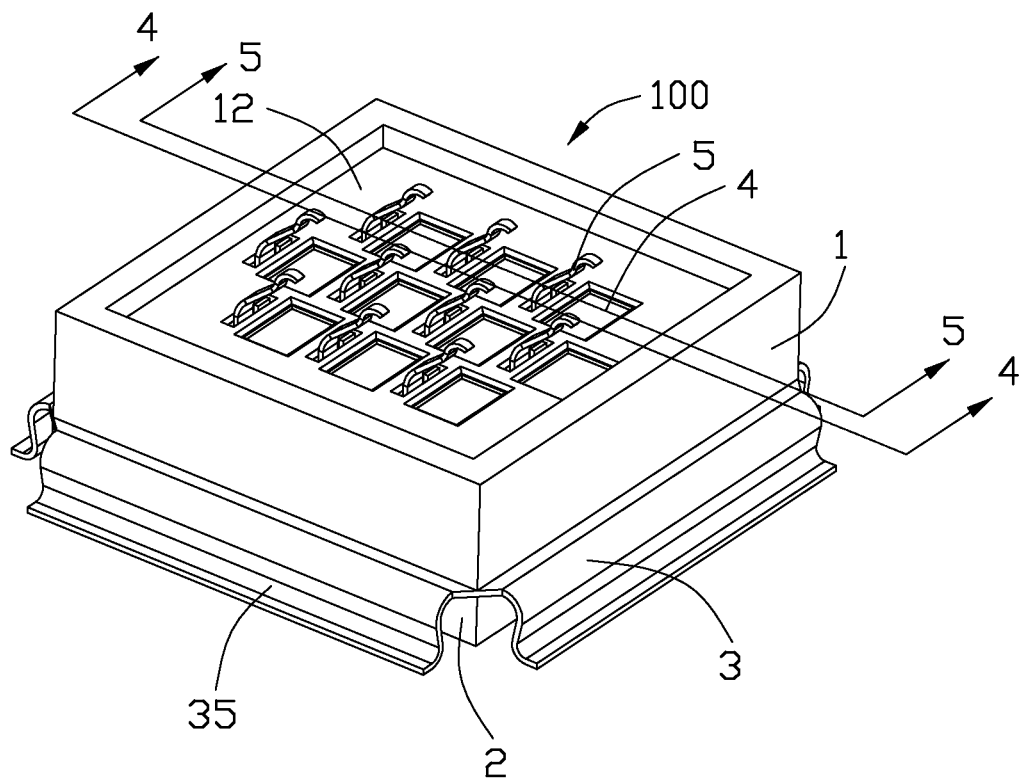
FIG. 1 is an assembled view of an electrical connector in accordance with a preferred embodiment of the present invention.
Figure 2:
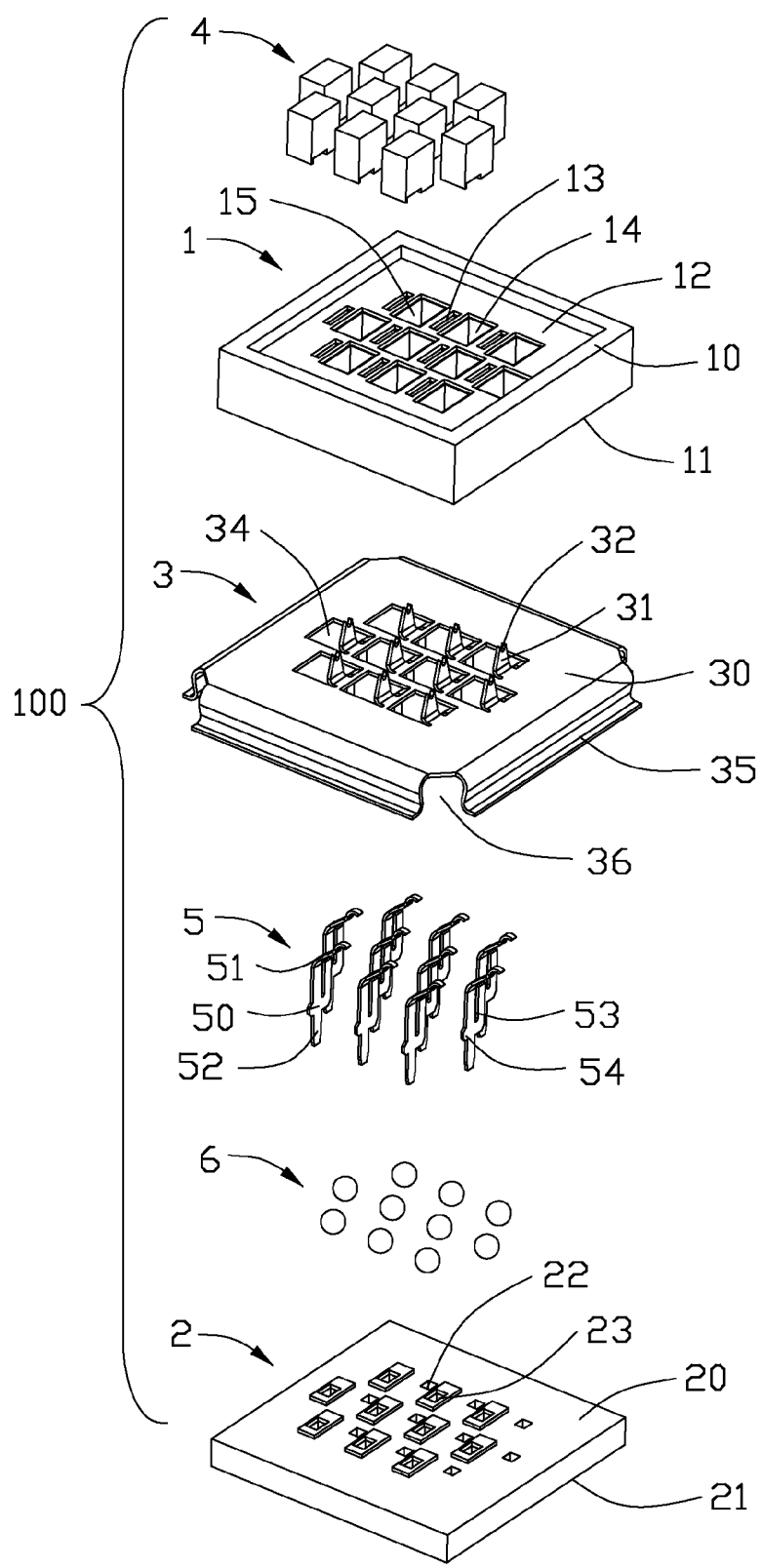
FIG. 2 is an exploded view of the electrical connector as shown in FIG. 1.

Referring to FIGS. 1-2, an electrical connector 100 according to the present invention is used to electrically connecting a chip module (not show) to a printed circuit board (not show) and comprises an insulative housing (not labeled) with a plurality of terminals 5 and absorbing material blocks 4 received therein, a metal plate 3 positioned on the insulative housing by insert molded or assembling process and a plurality of solder balls 6 soldered the terminals 5 to the printed circuit board. The absorbing material blocks 4 are made of absorbing material transformed electromagnetic wave into thermal energy.

Figure 3:
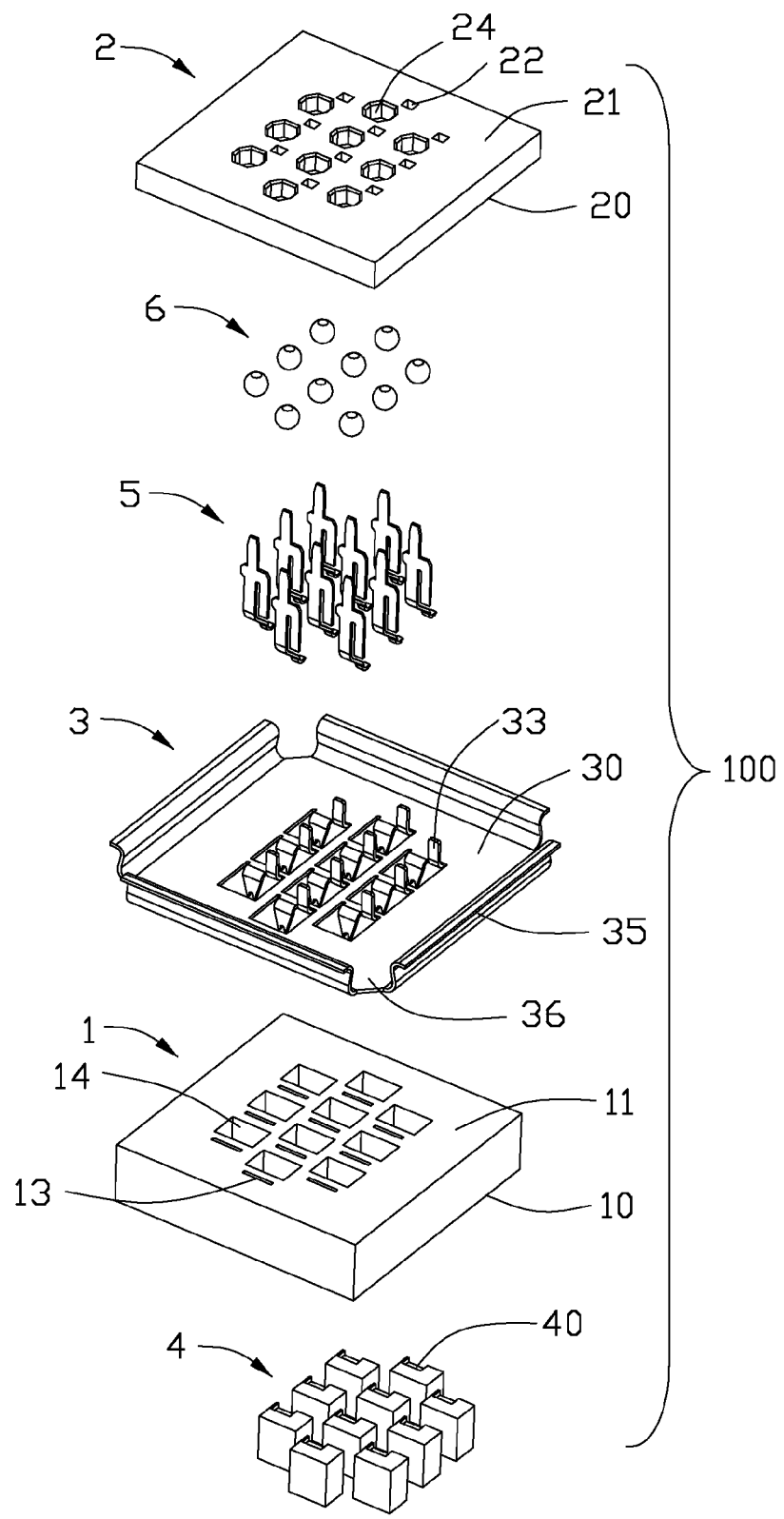
FIG. 3 is another exploded view of the electrical connector as shown in FIG. 1.
Figure 4:
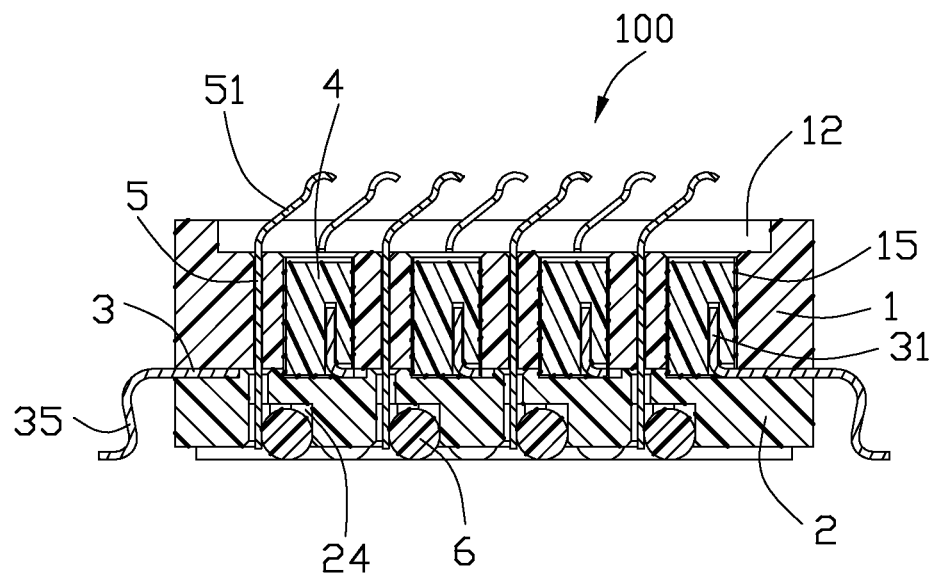
FIG. 4 is a cross-sectional view of the electrical connector taken along line 4-4 as shown in FIG. 1.

Referring to FIGS. 2-4, the insulative housing comprises a plurality of receiving slots (not labeled) and a plurality of passageways 14 spaced out the receiving slots. The terminals 5 are fixed in the receiving slots respectively. Inner surfaces of the passageways 14 are coated with metal layer 15 and the passageways 14 locate around the receiving slot. The absorbing material blocks 4 are received in the passageways 14 respectively.

In the preferred embodiment in accordance with the present disclosure, the insulative housing comprises a top insulative housing 1 and a bottom insulative housing 2 matched with the top insulative housing 1. The receiving slot comprises a top receiving slot 13 of the top insulative housing 1 and a bottom receiving slot 23 of the bottom insulative housing 2 corresponding to the top receiving slot 13. The top insulative housing 1 comprises a top surface 10 and a bottom surface 11 opposite to the top surface 10. The top insulative housing 1 further comprises a receiving room 12 depressed from the top surface 10 for receiving the chip module and the passageway 14 is disposed at the top insulative housing 1. The bottom insulative housing 2 comprises an upper surface 20, a lower surface 21 opposite to the upper surface 20, a plurality of depressions 24 depressed from the lower surface 21 and communicated with the bottom receiving slot 23 and a plurality of recesses 22 penetrated from the upper surface 20 to the lower surface 21 and located beside the bottom receiving slot 23.

The metal plate 3 is disposed between the top insulative housing 1 and the bottom insulative housing 2 and comprises a base 30 with flat shape, a plurality of through holes 34 passing through the base 30, a first bending portion 31 extending upwardly from one side of the through hole 34, a second portion 33 extending downwardly from the same side of the through hole 34 and at least four extending portions 35 extending outwardly and bending downwardly from the base 30. The first bending portion 31 and the second bending portion 33 extend in different directions and locate at the opposite side of the base 31. The first bending portion 31 is configured with triangle and comprises a groove 32 at an end thereof convenient for assembling to the top insulative housing 1. The first bending portion 31 of the metal plate 3 connects with the absorbing material block 4. The absorbing material block 4 has a connecting slot 40 depressed from the bottom thereof for receiving the first bending portion 31. The first bending portion 31 is interfered with the absorbing material block 4 and the second bending portion 33 is received in the recess 22. The metal plate 3 further comprises a plurality of nicks 36 generated at the four corners thereof for forming and manufacturing.

Referring to FIGS. 2, the terminal 5 comprises a body portion 50, a spring beam 51 extending upwardly from the body portion 50, a soldering portion 52 extending downwardly from the body portion 50, a retention portion 53 extending outwardly and upwardly from one side of the body portion 50 and a barb 54 extending outwardly from another side of the body portion 50. The retention portion 53 and the barb 54 are both interfered with the top receiving slot 13 for fixing the terminal 5 into the top insulative housing 1.

Figure 5:
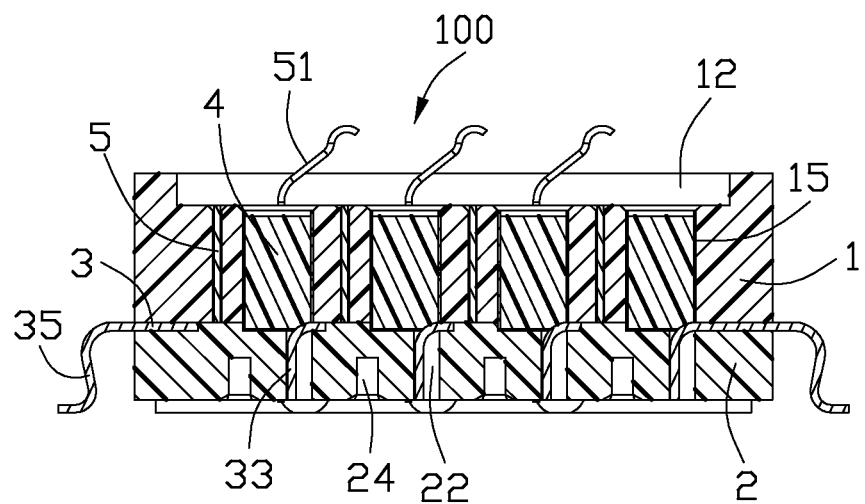
FIG. 5 is a cross-sectional view of the electrical connector taken along line 5-5 as shown in FIG. 1.

Referring to FIGS. 1 and 4-5, after assembling the electrical connector 100, the metal plate 3 is assembled between the top insulative housing 1 and the second insualtive housing 2. The terminal 5 is received in both of the top receiving slot 13 and the second receiving slot 23 and the solder ball 6 is received in the depression 24. The terminal 5 is soldered to the printed circuit board by the solder ball 6 and the spring beam 51 of the terminal 5 extends upwardly beyond the top surface 10 of the top insulative housing 1. The absorbing material block 4 is received in the passageway 14 and the first bending portion 31 of the metal plate 3 is received in the connecting slot 40 of the absorbing material block 4 and the second bending portion 33 is received in the recess 22.

The inner surface of the passageway 14 is coated with the metal layer 15 and the absorbing material block 4 is received in the passageway 14, when the electromagnetic wave send out from the adjacent terminals 5 enters into the passageway 14, because there is a difference between the impedance of the metal layer 15 and the impedance of the absorbing material block 4 and it forms a multiple reflection in the passageway 14, so the energy of the electromagnetic wave is transformed into thermal energy by the magnetic metal particle within the absorbing material block 4, then it can reduce the electromagnetic shielding interference between the adjacent terminals 5. The metal plate 3 made of metal material can shields the terminal 5, and, because of the difference between the impedance of the metal plate 3 and the impedance of the absorbing material, it also forms a multiple reflection of the electromagnetic wave send out between the adjacent terminals 5, so, the absorption efficiency of absorbing material is maximized. The first bending portion 31 of the metal plate 3 contacting with the absorbing material block 4 can sends out the thermal energy generated by the absorbing material block 4 due to absorb the electromagnetic wave.

In the preferred embodiment in accordance with the present disclosure, in order to get a better absorption efficiency, the width of the passageway 14 perpendicular to the direction of the retention portion 53 is larger than the top receiving slot 13 and the absorbing material block 4 is filled in the passageway 14.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An electrical connector electrically connecting a chip module to a printed circuit board, comprising:
   an insulative housing comprising a plurality of receiving slots and a plurality of passageways spaced from and located beside the receiving slot so as to have said receiving slots and said passageways alternatively arranged with each other in matrix; and
   a plurality of terminals each received in the receiving slot of the insulative housing, and wherein;
   the electrical connector further comprises a plurality of absorbing material blocks received in the corresponding passageways, respectively, said absorbing material blocks transforming electromagnetic wave into thermal energy.

2. The electrical connector as claimed in claim 1, wherein in each of the passageways, a metallic layer is applied between an inner surface of the passageway and the corresponding absorbing material block, and attached to one of said inner surface and said absorbing material block.

3. The electrical connector as claimed in claim 2, wherein said electrical connector further comprises a metal plate insert associated with the insulative housing for radiating heat, and the metal plate contacts with the absorbing material block.

4. The electrical connector as claimed in claim 3, wherein said metal plate comprises a base with flat shape, a first bending portion bending upwardly from the base, a second bending portion bending downwardly from the base and an extending portion extending outwardly and bending downwardly from the base.

5. The electrical connector as claimed in claim 4, wherein said base comprises a plurality of through holes passing through the base, the first bending portion and the second bending portion extend in different directions and locate at the opposite side of the base and the first bending portion contacts with the absorbing material block.

6. The electrical connector as claimed in claim 2, wherein said connector further includes a metallic grounding plate below said passageways, and the metallic layers of said passageways are mechanically and electrically connected to said metallic grounding plate.

7. The electrical connector as claimed in claim 2, wherein said insulative housing comprises a top insulative housing, a bottom insulative housing matched with the top insulative housing and a metal plate assembled between the top insulative housing and the bottom insulative housing and the metal plate contacts with the absorbing material block for radiating heat.

8. The electrical connector as claimed in claim 7, wherein said metal plate comprises a base with flat shape, a first bending portion bending upwardly from the base, a second bending portion bending downwardly from the base and an extending portion extending outwardly and bending downwardly from the base.

9. The electrical connector as claimed in claim 8, wherein said base comprises a plurality of through holes passing through the base, the first bending portion and the second bending portion extend in different directions and locate at the opposite side of the base and the first bending portion contacts with the absorbing material block.

10. The electrical connector as claimed in claim 7, wherein said receiving slot comprises a top receiving slot in the top insulative housing and a bottom receiving slot in the bottom insulative housing.

11. The electrical connector as claimed in claim 10, wherein said top insulative housing comprises a top surface, a bottom surface opposite to the top surface and a receiving room depressed from the top surface for receiving the chip module, the passageway is located at the top insulative housing.

12. The electrical connector as claimed in claim 11, wherein said bottom insulative housing comprises an upper surface, a lower surface opposite to the upper surface, a plurality of recesses penetrated from the upper surface to the lower surface and a depression depressed from the lower surface and communicated with the bottom receiving slot, the recess is located beside the bottom receiving slot and the second bending portion is received in the recess.

13. The electrical connector as claimed in claim 2, wherein said absorbing material blocks are assembled into the insulative housing from top to bottom and located at the center of the passageways, the absorbing material blocks are made of absorbing material transforming electromagnetic wave into thermal energy.

14. An electrical connector electrically connecting a chip module to a printed circuit board, comprising:
a first insulative housing comprising a plurality of first receiving slots and a plurality of passageways located beside the first receiving slots and spaced out the first receiving slots;
a second insulative housing comprising a plurality of second receiving slots of the first insulative housing and a plurality of recesses located beside the second receiving slot of the second insulative housing;
a plurality of terminals received in both of the first receiving slot and the second receiving slot;
a metal plate located between the first insulative housing and the second insulative housing;
the electrical connector further comprises a plurality of absorbing material blocks received in the passageways of the first insulative housing, the passageway has an inner surface coated with an metal layer and the absorbing material block is located inside the metal layer, the absorbing material blocks are assembled into the insulative housing from top to bottom, the metal plate interferes with the absorbing material block.

15. The electrical connector as claimed in claim 14, wherein said metal plate comprises a base with flat shape, a plurality of first bending portions and a plurality of second bending portions bending upwardly and downwardly from the base respectively, the first bending portion and the second bending portion extend in different directions and locate at the opposite side of the base, the absorbing material block has a connecting slot depressed from the bottom thereof for receiving the first bending portion and the first bending portion contacts with the absorbing material block.

16. The electrical connector as claimed in claim 14, wherein said terminal comprises a body portion, a spring beam bending upwardly from the body portion, a soldering portion extending downwardly from the body portion, a retention portion extending outwardly and upwardly from one side of the body portion and a barb extending outwardly from the another side of the body portion, the electrical connector further comprises a plurality of solder balls fixed to the printed circuit board.

17. An electrical connector comprising:
an upper insulative housing defining a plurality of upper receiving slots extending therethrough in a vertical direction;
a lower insulative housing defining a plurality of lower receiving slots extending therethrough in the vertical direction;
a plurality of terminals each defining a vertical retention section extending through the corresponding upper receiving slot and lower receiving slot, a lower tail section extending downwardly from the retention section and soldered to a solder ball for mounting to a printed circuit board, and an upper contacting section extending above an upper surface of the upper housing for engagement with an electronic component;
a plurality of metallic shielding layer structures alternately arranged among while isolated from the upper receiving slots to shield the neighboring terminals, respectively; and
a metallic grounding plate sandwiched between said upper housing and said lower housing in the vertical direction; wherein
the metallic shielding layers are electrically and mechanically connected to the metallic grounding plate.

18. The electrical connector as claimed in claim 17, wherein each of said metallic shielding layers defines a tubular configuration.

19. The electrical connector as claimed in claim 17, wherein each of said shielding layers is associated with an absorbing material transforming electromagnetic wave into thermal energy.

20. The electrical connector as claimed in claim 19, wherein said metallic shielding plate is mechanically and thermally connected to the absorbing material.

\* \* \* \* \*